United States Patent
Chen et al.

(10) Patent No.: US 7,641,820 B2
(45) Date of Patent: Jan. 5, 2010

(54) NANO COMPOUNDS AND ORGANIC MEMORY DEVICES COMPRISING THE SAME

(75) Inventors: Chun-Jung Chen, Taoyuan County (TW); Gue-Wuu Hwang, Kaohsiung (TW); Ching Ting, Hsinchu (TW); Yi-Jen Chan, Taoyuan County (TW); Zing-Way Pei, Taichung (TW); Chia-Chieh Chang, Taipei (TW); Chen-Pang Kung, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/410,988

(22) Filed: Apr. 26, 2006

(65) Prior Publication Data

US 2007/0252110 A1    Nov. 1, 2007

(51) Int. Cl.
*H01B 1/02*    (2006.01)
*H01B 1/12*    (2006.01)

(52) U.S. Cl. .............. 252/519.3; 252/512; 252/514; 252/518.1; 252/519.34; 252/500; 977/773; 977/778; 977/779; 977/811; 977/827

(58) Field of Classification Search ............. 365/232; 252/500, 512, 514, 518.1, 519.3, 519.34; 977/773, 778, 779, 811, 827

See application file for complete search history.

(56) References Cited

U.S. PATENT DOCUMENTS 6,950,331 B2    9/2005    Yang et al.
7,563,507 B2 *  7/2009    Emrick et al. ............... 428/402

OTHER PUBLICATIONS

Ouyang et al. ("Programmable polymer thin film and non-volatile memory device" Nature Materials, vol. 3, pp. 918-922, published online on Nov. 28, 2004).*
Ouyang et al. ("Organic Memory Device Fabricated Through Solution Processing" Proceedings of the IEE, vol. 83, pp. 1287-1296, Jul. 2005).*
Tseng et al. ("Nanoparticle-induced negative differential resistance and memory effect in polymer bistable light-emitting device" Applied Physics Letters 88, 123506, published online on Mar. 21, 2006).*
Daniel et al. ("Gold Nanoparticles: Assembly, Supramolecular Chemistry, Quantum-Size-Related properties, and Applications toward Biology, Catalysis, and Nanotechnology" Chem. Rev., 104, pp. 293-346, 2004).*

* cited by examiner

*Primary Examiner*—Mark Kopec
*Assistant Examiner*—Tri V Nguyen
(74) *Attorney, Agent, or Firm*—Birch, Stewart, Kolasch & Birch, LLP

(57) ABSTRACT

A nano compound. The nano compound includes a metal or oxide thereof and an organic compound capable of oxidation and reduction bonded to the metal or oxide thereof. The invention also provides an organic memory device including the nano compound.

15 Claims, 3 Drawing Sheets

NANO COMPOUNDS AND ORGANIC MEMORY DEVICES COMPRISING THE SAME

BACKGROUND OF THE INVENTION

1. Field of the Invention

The invention relates to a compound, and in particular to a nano compound capable of data storage and an organic memory device comprising the same.

2. Description of the Related Art

In the development of flexible electronic material, organic material is popular due to its light weight, low cost, simple process ability, and large area fabrication capability.

Organic non-volatile memory material (ONVM) can be widely applied in Radio-Frequency Identification (RFID) holders and memory products. In terms of cost considerations, cheap ONVM is a suitable to substitute for conventional non-volatile memory materials.

ONVM material can be formed by low-conductivity organic compounds and metal nano particles. When an external bias is applied, electrons are transferred from organic compound to metal nano particle. After applying a counter bias, electrons return to the organic compound.

UCLA Prof. Yang Yang provided an organic memory device disclosed in U.S. Pat. No. 6,950,331. Organic compounds and metal nano particles, however, are randomly blended in a polymer solution. Meanwhile, the low melting point of the organic compound will cause a low thermal stability.

In 2005, Yang Yang provided another organic memory device disclosed in Applied Physics Letter 86, 123507 (2005). The ONVM material is composed of 2-naphthalenethiol-gold nanoparticle. The memory device, however, is Write-once-Read Many times (WORM) and has an $I_{on}/I_{off}$ ratio less than $10^4$, without rewritable performance.

BRIEF SUMMARY OF THE INVENTION

The invention provides a nano compound comprising a metal or oxide thereof and an organic compound capable of oxidation and reduction bonded to the metal or oxide thereof.

The invention also provides an organic memory device comprising a top and a bottom electrode and a polymer film comprising the disclosed nano compound sandwiched therebetween.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawing, which are given by way of illustration only, and thus are not limitative of the present invention, and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The invention provides a nano compound comprising a metal or oxide thereof and an organic compound capable of oxidation and reduction bonded to the metal or oxide thereof.

The metal has a work function of about 2~8 eV, preferably 4~6 eV, and may comprise gold. The metal or oxide thereof has a diameter less than 100 nm, preferably less than 15 nm.

The organic compound may be a conjugated molecule, and may comprise hydroxyquinoline such as 8-hydroxyquinoline.

The organic compound is bonded to the metal or oxide thereof with a nonresonance organic chain. The organic chain may further comprise nitrogen atoms such that a carbon-carbon or carbon-nitrogen-carbon chain is built. The organic chain has a length of less than 10 nm, preferably less than 6 nm.

The metal or oxide thereof may serve as an electron acceptor. The organic compound may serve as an electron donor. Electrons are transferred therebetween by applying an external bias such as positive bias or negative bias, for example, when a positive bias is applied, electrons are transferred from the organic compound (electron donor) to the metal or oxide thereof (electron acceptor). When a negative bias is applied, electrons return to the organic compound. The electronic transition is attributed to the electric-field-induced charge transfer. The metal or oxide thereof achieves and remains a high-conductivity state while electrons are received thereby. After applying a counter bias, the metal or oxide thereof returns to the original low-conductivity state.

The nano compound is filmed by dissolving in polymer solution, with concentration of about 5~50 wt %. The polymer has a conductivity less than $10^{-6}$ mho/cm.

The invention also provides an organic memory device comprising a top and a bottom electrode and a polymer film comprising the disclosed nano compound sandwiched therebetween.

The electrodes may comprise aluminum. The memory device has an applied voltage of about 1~10V and an $I_{on}/I_{off}$ ratio exceeding $10^4$. The device is non-volatile and rewritable.

Figure 1:
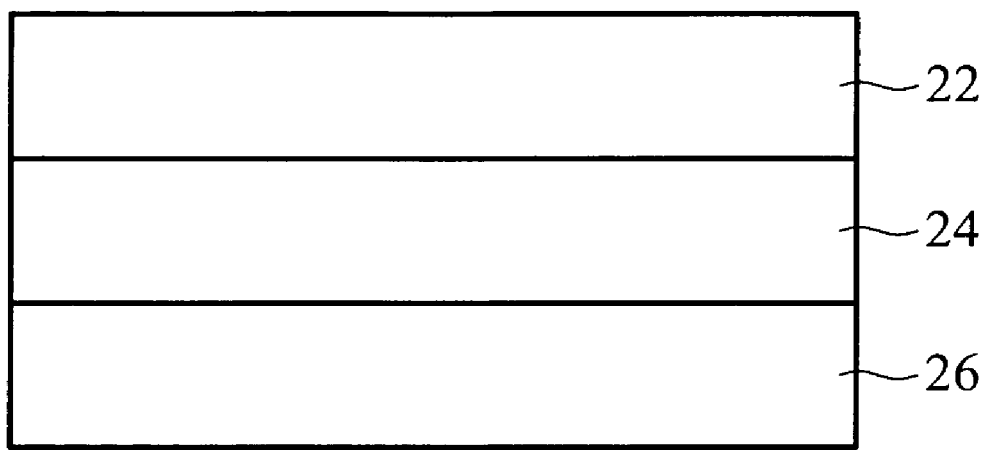
FIG. 1 is a cross section of the organic memory device of the invention.

Referring to FIG. 1, the organic memory device of the invention is disclosed. The memory device 20 comprises a top electrode 22 and a bottom electrode 26, and a polymer film 24 comprising the disclosed nano compound is installed therebetween.

The invention provides an organic non-volatile memory material (ONVM) formed of a metal nano particle serving as an electron acceptor and an organic compound capable of oxidation and reduction serving as an electron donor. The distance of charge transfer is determined by length of a nonresonance organic chain formed therebetween. Applied voltage and $I_{on}/I_{off}$ ratio of memory device can also be controlled thereby. Additionally, phase separation caused by metal aggregation can thus be avoided due to formation of the nonresonance organic chain.

When a positive bias is applied, the metal nano particle receives electrons transferred from the organic compound, exhibiting a high-conductivity state. The high-conductivity state remains due to the non-volatile property of ONVM material. Next, metal nano particle releases electrons after applying a negative bias thereto and returns to the original low-conductivity state. These operations, including application of positive or negative bias, can be repeated such that the memory device is rewritable.

Figure 2:
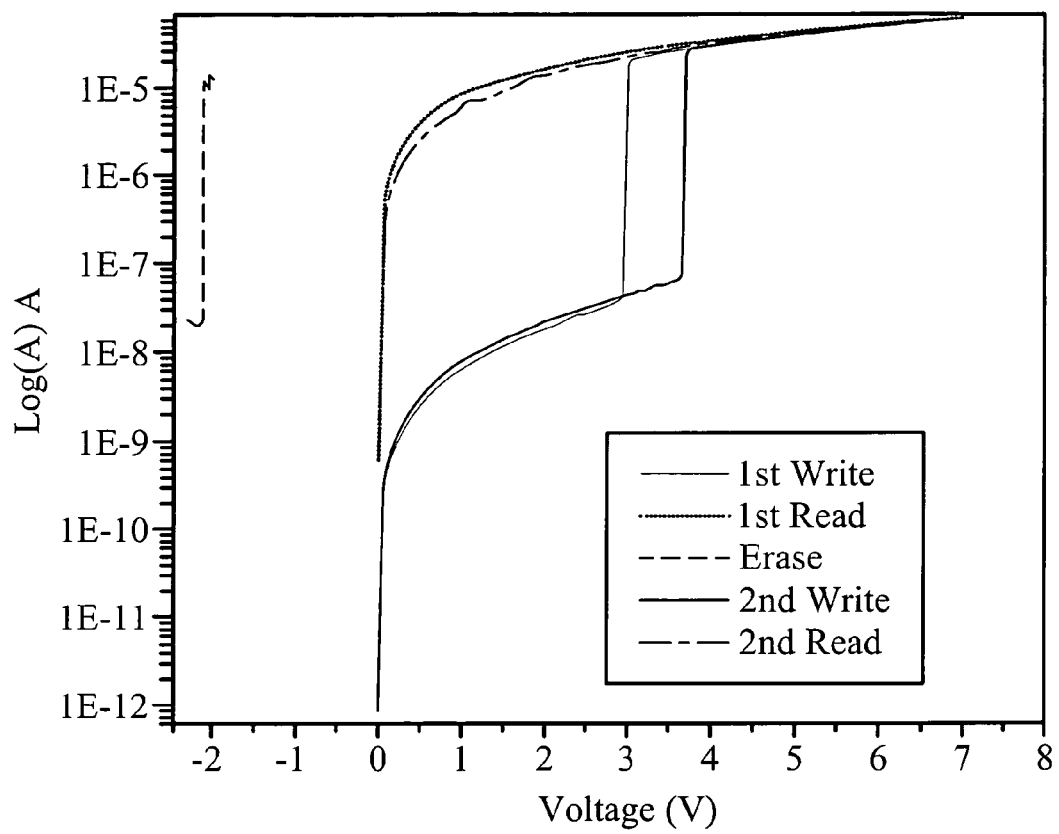
FIG. 2 shows the electrical performance of the organic memory device of the invention.
Figure 3:
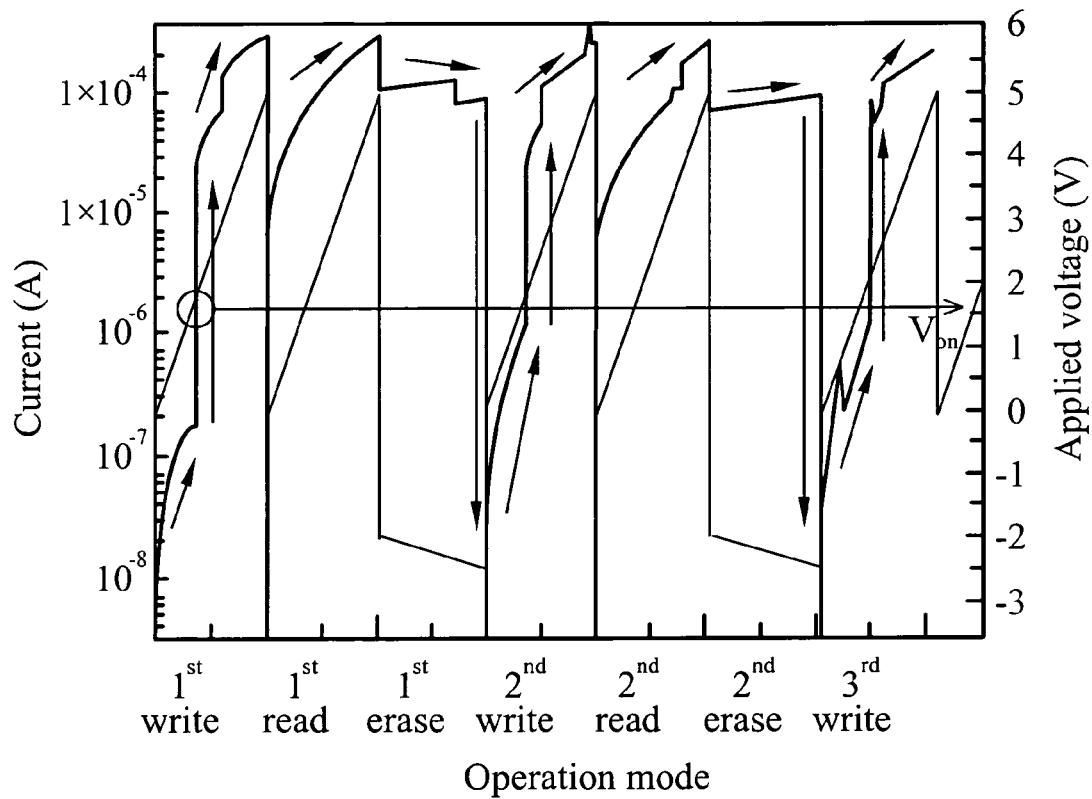
FIG. 3 shows the rewritable performance of the organic memory device of the invention.

Referring to FIG. 2 and FIG. 3, when data is erased by applying a negative 2V bias, the current value of the memory device can return to the original state before written, exhibiting rewritable performance.

The nano compound is prepared as follows. A functional group capable of oxidation and reduction such as hydroxyl group, pyridene, or thiole of an organic compound such as hydroxyquinoline, indole, or thiophene is protected by a protector such as ether or ester group. Next, a nonresonance organic chain such as alkyl or. cycloalkyl is bonded to the organic compound. The terminal of the organic chain is then replaced by a mercaptan group. After removing the protector; the-organic compound is bonded to a metal or oxide thereof such as gold or palladium with the nonresonance organic chain to form the nano compound.

EXAMPLE 8-hydroxyquinoline-gold Particle Preparation (1) 5-chloro-8-methoxycuinoline (CMQ) Preparation

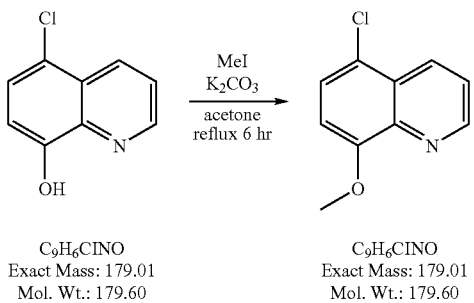

10.0 g 5-chloro-8-hydroxyquinoline (55.87 mmol) and 150 mL acetone were added to a 250 mL round-bottom flask with violent stirring and reflux. 11.57 g potassium carbonate (83.81 mmol) and 11.9 g iodo methane were then added and reacted at 75° C. in an oil bath for 6 hours. After removing unreacted iodo methane by re-concentration, brown oil-like results and unreacted potassium carbonate were obtained. Next, unreacted potassium carbonate and acetone were removed by adding 150 mL deionized water to leave the brown oil-like results. The brown oil-like results were then added to 150 mL deionized water with stirring. After precipitation and filtration, 9.5 g yellow sheeted 5-chloro-8-methoxyquinoline (CMQ) solid was prepared.

(2) 5-(12-bromo-dodecane)-8-methoxvguinoline (BDMQ) Preparation

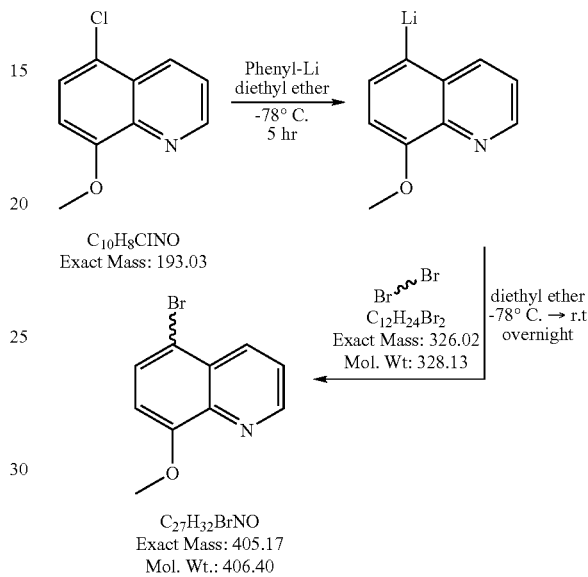

0.96 g 5-chloro-8-methoxyquinoline (CMQ) (5 mmol) and 200 mL dried and degassed diethyl ether were added to a 250 mL round-bottom flask with violent stirring at −78° C. in IPA (isopropyl alcohol) ice bath under nitrogen gas. Next, 2.5 mL phenyllithium (2.0 M) was added and reacted at −78° C. for 2 hours to form a first solution. 3.26 g 1,12-dibromododecane (10.0 mmol) and 80 mL dried and degassed diethyl ether were added to a 500 mL flask with violent stirring at −78° C. in IPA (isopropyl alcohol) ice bath under nitrogen gas to form a second solution. Next, the first solution was slowly added to the second solution and reacted for 1 hour then gently warmed to room temperature and stirred overnight. After removing diethyl ether by re-concentration, the resulting solution was dissolved in 100 mL n-hexane and extracted by adding 150 mL deionized water more than 3 times until a colorless extract solution comprising an aqueous phase and an oil phase was obtained. The oil phase was then re-concentrated to remove n-hexane and purified by SiO$_2$ column (250 mL n-hexane). After removing unreacted 1,12-dibromododecane, the results were purified by SiO$_2$ column (250 mL EA/n-hexane (⅛)) and re-concentrated to remove solvent to form 1.2 g yellow oil-like 5-(12-bromo-dodecane)-8-methoxyquinoline (BDMQ).

(3) 5-(12-thiol-dodecane)-8-methoxyquinoline (TDMQ) Preparation

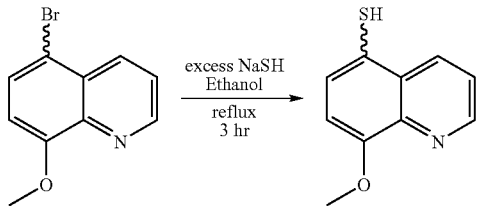

C$_{27}$H$_{32}$BrNO
Exact Mass: 405.17
Mol. Wt.: 406.40

C$_{22}$H$_{33}$NOS
Exact Mass: 359.23
Mol. Wt.: 359.57

0.74 g 5-(12-bromo-dodecane)-8-methoxyquinoline (BDMQ) (1.82 mmol) and 40 mL ethanol were added to a 100 mL round-bottom flask with violent stirring with reflux. 0.45 g NaSH.XH$_2$O (68%, 5.46 mmol) was then added and reacted at 85° C. in an oil bath for 3 hours. After re-concentration, brown oil-like results and unreacted NaSH solid were obtained. The oil-like results were then extracted by adding 100 mL deionized water and 100 mL ether 3 times to remove the NaSH solid and ethanol to form a colorless extract solution comprising an aqueous phase and a oil phase. The oil phase was then re-concentrated to remove ether and purified by SiO$_2$ column (250 mL EA/n-hexane (⅛)). After removing solvent by re-concentration, 0.5 g yellow oil-like 5-(12-thiol-dodecane)-8-methoxyquinoline (TDMQ) was obtained.

(4) 5-(12-thiol-dodecane)-8-hydroxyquinoline (TDHQ) Preparation

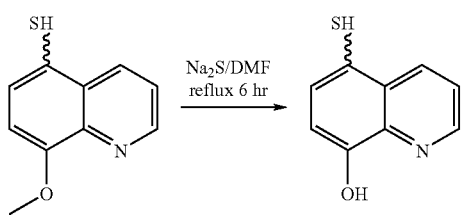

C$_{22}$H$_{33}$NOS
Exact Mass: 359.23
Mol. Wt.: 359.57

C$_{21}$H$_{31}$NOS
Exact Mass: 345.21
Mol. Wt.: 345.54

0.46g 5-(12-thiol-dodecane)-8-hydroxyquinoline (TDHQ) (1.27 mmol) and 25 mL dimethyl formamide (DMF) were added to a 50 mL round-bottom flask with violent stirring. 0.49 g Na$_2$S.H$_2$O (5.91 mmol) was then added and reacted at 155° C. in an oil bath under nitrogen gas for 6 hours. After removing DMF by re-concentration, brown oil like results and unreacted Na$_2$S solid were obtained. The oil-like results were then extracted by adding 100 mL deionized water and 100 mL ether 3 times to remove the Na$_2$S solid and ethanol to form a colorless extract solution comprising an aqueous phase and an oil phase. The oil phase was then re-concentrated to remove ether and purified by SiO$_2$ column (250 mL EA/n-hexane (⅛)). After removing solvent by re-concentration, 0.25 g yellow oil-like 5-(12-thiol-dodecane)-8-hydroxyquinoline (TDHQ) was obtained.

(5) 8-hydroxyquinoline-gold Particle Preparation

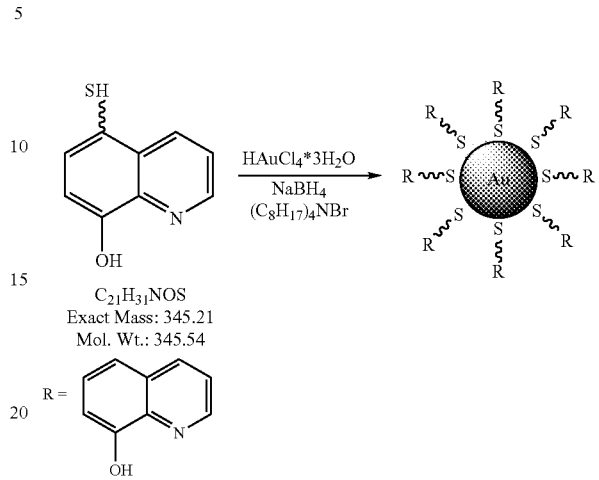

C$_{21}$H$_{31}$NOS
Exact Mass: 345.21
Mol. Wt.: 345.54

0.12 g hydrogen tetrachloroaurate (III) trihydrate (0.30 mmol) was dissolved in 5 mL deionized water to form a first solution. 0.11 g 5-(12-thiol-dodecane)-8-hydroxyquinoline (TDHQ) (0.32 mmol) and 0.58 g tetraoctylammonium bromide (1.06 mmol) were added to 50 mL p-xylene to form a second solution. Next, the first and second solutions were added to a 250 mL round-bottom flask with violent stirring. 0.147 g NaBH4 (3.89 mmol) was dissolved in 10 mL deionized water to prepare a reductant. Next, the reductant was added and reacted with violent stirring for 3 hours to form a solution comprising an aqueous phase and an oil phase. The oil phase was then re-concentrated to form about 5 mL resulting solution. Next, the resulting solution was precipitated by adding dried methanol. The suspension was centrifuged (3000 rpm, 15 min) to precipitate Au—NPs. Au—NPs solid was washed by deionized water and methanol 3 times, respectively, to remove unreacted substance and salts. After drying; 0.05 g purple 8-hydroxyquiline-gold particle solid was prepared, ranging from 5 nm to 45 nm.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A nano compound, comprising:
   a metal or oxide thereof;
   a nitrogen-containing organic chain bonded to the metal or oxide thereof; and
   hydroxyquinoline capable of oxidation and reduction bonded to the nitrogen-containing organic chain,
   wherein a hydroxyquinoline precursor is reacted with alkylammonium bromide to form the nitrogen-containing organic chain, such that the nitrogen-containing organic chain is covalently bonded to the hydroxyquinoline.

2. The nano compound as claimed in claim 1, wherein the metal has a work function of about 2-8 eV.

3. The nano compound as claimed in claim 1, wherein the metal has a work function of about 4-6 eV.

4. The nano compound as claimed in claim 1, wherein the metal comprises gold.

5. The nano compound as claimed in claim 1, wherein the metal or oxide thereof has a diameter less than 100 nm.

6. The nano compound as claimed in claim 1, wherein the metal or oxide thereof has a diameter less than 15 nm.

7. The nano compound as claimed in claim 1, wherein the hydroxyquinoline is a conjugated molecule.

8. The nano compound as claimed in claim 1, wherein the organic chain has a length less than 10 nm.

9. The nano compound as claimed in claim 1, wherein the organic chain has a length less than 6 nm.

10. The nano compound as claimed in claim 1, wherein the metal or oxide thereof is an electron acceptor, and the hydroxyquinoline is an electron donor.

11. The nano compound as claimed in claim 10, wherein electrons are transferred between the metal or oxide thereof and the hydroxyquinoline by applying an external bias.

12. The nano compound as claimed in claim 11, wherein the metal or oxide thereof remains a high-conductivity state while electrons are received thereby.

13. The nano compound as claimed in claim 1, wherein the nano compound is dissolved in polymer solution.

14. The nano compound as claimed in claim 13, wherein the polymer has conductivity less than $10^{-6}$ ohm/cm.

15. The nano compound as claimed in claim 13, wherein the nano compound has concentration of about 5-50 wt. % in the polymer solution.

* * * * *